(12) United States Patent
Kim et al.

(10) Patent No.: US 11,699,770 B2
(45) Date of Patent: Jul. 11, 2023

(54) ENERGY HARVESTING SYSTEM USING A SOLAR CELL AND THERMOELECTRIC DEVICE

(71) Applicant: Korea University Research and Business Foundation, Seoul (KR)

(72) Inventors: Sang Sig Kim, Seoul (KR); Kyoung Ah Cho, Seoul (KR); Seung Gen Yang, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 17/558,488

(22) Filed: Dec. 21, 2021

(65) Prior Publication Data

US 2023/0006084 A1   Jan. 5, 2023

(30) Foreign Application Priority Data

Jul. 2, 2021 (KR) .......................... 10-2021-0087125

(51) Int. Cl.
*H02S 10/30* (2014.01)
*H02S 40/44* (2014.01)
(Continued)

(52) U.S. Cl.
CPC .......... *H01L 31/0525* (2013.01); *H01L 25/16* (2013.01); *H02J 50/001* (2020.01);
(Continued)

(58) Field of Classification Search
CPC ...... H01L 31/00–078; H01L 35/00–34; H10N 10/00–857; Y02E 10/50–60; H02S 10/30; H02S 40/40–44
(Continued)

(56) References Cited

U.S. PATENT DOCUMENTS

2022/0293840 A1 *  9/2022  Lee ..................... H01L 35/14

FOREIGN PATENT DOCUMENTS

CN   108831947     * 11/2018
CN   109104138 A    12/2018
(Continued)

OTHER PUBLICATIONS

KR20110036152 English translation (Year: 2011).*
(Continued)

*Primary Examiner* — Bach T Dinh
(74) *Attorney, Agent, or Firm* — Hauptman Ham, LLP

(57) ABSTRACT

The present disclosure relates to an energy harvesting technology for generating electrical energy by using a combination of a solar cell and a thermoelectric device. An energy harvesting system according to one embodiment of the present disclosure may include a solar cell for generating electrical energy based on sunlight; a heat transfer layer formed on at least one edge portion of the upper surface of the solar cell on which sunlight is incident; and a thermoelectric device including a first electrode, a second electrode, a thermoelectric channel disposed between the first and second electrodes, having a horizontal structure in which the first electrode is disposed on the heat transfer layer to be arranged horizontally with respect to the solar cell, and configured to generate additional electrical energy based on the temperature difference between the first and second electrodes.

12 Claims, 7 Drawing Sheets

(51) Int. Cl.
  *H10N 10/00* (2023.01)
  *H01L 31/0525* (2014.01)
  *H02J 50/00* (2016.01)
  *H01L 25/16* (2023.01)
  *H10N 10/855* (2023.01)
(52) U.S. Cl.
  CPC .............. *H02S 10/30* (2014.12); *H02S 40/44* (2014.12); *H10N 10/855* (2023.02); *H02J 2300/24* (2020.01); *Y02E 10/60* (2013.01)
(58) Field of Classification Search
  USPC .................................................. 136/200–265
  See application file for complete search history.

(56) References Cited

FOREIGN PATENT DOCUMENTS

| JP | 2008-153915 | A | | 7/2008 |
|---|---|---|---|---|
| KR | 20110036152 | | * | 4/2011 |
| KR | 10-2017-0053255 | A | | 5/2017 |
| KR | 10-2018-0121486 | A | | 11/2018 |
| KR | 10-2019-0073895 | A | | 6/2019 |
| KR | 20200004660 | | * | 1/2020 |

OTHER PUBLICATIONS

CN108831947 English translation (Year: 2018).*
KR20200004660 English (Year: 2020).*
Bahadir Acar et al., "Investigation of Energy Generation at Test System Designed by Use of Concentrated Photo-Voltaic Panel And Thermoelectric Modules," International Journal of Renewable Energy Research, Dec. 2018, vol. 8, No. 4, pp. 1859-1867.
Wei Zhu et al., "Thin-film solar thermoelectric generator with enhanced power output: Integrated optimization design to obtain directional heat flow," Energy, 2015, vol. 89, pp. 106-117.
Korean Office Action dated Oct. 12, 2022, in connection with the Korean Patent Application No. 10-2021-0087125, 5 pages.

* cited by examiner

600

601  602  603

ENERGY HARVESTING SYSTEM USING A SOLAR CELL AND THERMOELECTRIC DEVICE

CROSS-REFERENCE TO RELATED APPLICATION

This application claims priority to Korean Patent Application No. 10-2021-0087125, filed on Jul. 2, 2021 in the Korean Intellectual Property Office, the disclosure of which is incorporated herein by reference.

BACKGROUND OF THE DISCLOSURE

Field of the Disclosure

The present disclosure relates to an energy harvesting technology for generating electrical energy by using a combination of a solar cell and a thermoelectric device, and more particularly, to an energy harvesting technology for generating electrical energy of a solar cell and electrical energy of a thermoelectric device at the same time by disposing the thermoelectric device having a horizontal structure at the edges of the upper surface of the solar cell.

Description of the Related Art

Recently, as depletion of existing energy resources such as oil and coal is predicted, interest in alternative energy sources that can replace such energy resources is increasing.

Among alternative energy sources, solar cells are particularly attracting attention because sunlight is an abundant energy resource and does not cause environmental pollution.

Solar cells include a solar power cell that generates electricity required to rotate a turbine by using solar heat and a solar photovoltaic cell that converts sunlight into electrical energy by using the properties of a semiconductor.

A solar cell has a junction structure of a p-type semiconductor and an n-type semiconductor like a diode. When light is incident on a solar cell, due to interaction between the light and a material constituting the semiconductor of the solar cell, negatively (−) charged electrons and positively (+) charged holes created by loss of electrons are generated. At this time, as the electrons and the holes move, current flows.

In addition, a solar cell is an energy harvesting device that can instantly convert an energy source, such as heat or sunlight, existing around in the device into electrical energy. However, since the amount of the energy source varies according to surrounding environments, the amount of generated electrical energy is limited.

The energy harvesting device is a device that generates electrical energy using heat, friction, pressure, sunlight, or the like, and may include a thermoelectric device, a solar cell, a piezoelectric device, and a triboelectric device.

To increase the amount of electrical energy generated from ambient temperature, an energy system linked to an energy harvesting device is being developed.

However, in the case of an energy harvesting technology according to the related art, the amount of electrical energy generated by an energy harvesting device is limited. In addition, there are matters to be improved in terms of electrical energy production.

In addition, research in the field of energy harvesting technology that generates electrical energy using sunlight, heat, friction, pressure, or the like is being actively conducted.

Due to increase in the amount of energy used in daily life, it is required to develop energy generation methods using sunlight or micro thermal energy and usable power sources.

In addition, for application of energy harvesting devices, it is essential to develop a system with a high degree of integration and to increase the amount of power produced per area.

SUMMARY OF THE DISCLOSURE

Therefore, the present disclosure has been made in view of the above problems, and it is an object of the present disclosure to maximize space utilization by applying a thermoelectric device to a solar cell, generate electrical energy through the solar cell, and generate additional electrical energy through the thermoelectric device using the heat of the solar cell.

It is another object of the present disclosure to provide a space utilization method of increasing electrical energy production while maintaining the electrical energy production performance of a solar cell using only the minimum space of the solar cell by forming a thermoelectric device having a horizontal structure on the solar cell.

It is still another object of the present disclosure to provide an energy harvesting system having improved power generation performance by simultaneously converting solar energy into electrical energy in a solar cell and a thermoelectric device, and allowing the generated electrical energy to be used immediately.

It is still another object of the present disclosure to increase the production of electrical energy without additional space by fabricating a thermoelectric device having a horizontal structure using a semiconductor process technology to be smaller than a solar cell.

It is still another object of the present disclosure to improve energy harvesting performance by securing high thermal conductivity from a solar cell to a thermoelectric device while securing the electrical energy production efficiency of the solar cell based on a horizontal structure of the solar cell and the thermoelectric device.

It is still another object of the present disclosure to provide an energy harvesting system capable of increasing the lifespan and operating time of products when applied to wearable devices, non-powered sensors, home appliances, and industrial apparatus, and capable of playing a key power supply role in various fields ranging from home appliances to industrial apparatus by using the energy of the natural world.

It is yet another object of the present disclosure to provide an energy harvesting system that aids in overcoming an energy crisis by creating various social and cultural innovations when applied to the fourth industry and wearable devices.

In accordance with one aspect of the present disclosure, provided is an energy harvesting system including a solar cell for generating electrical energy based on sunlight; a heat transfer layer formed on at least one edge portion of an upper surface of the solar cell on which sunlight is incident; and a thermoelectric device including a first electrode, a second electrode, a thermoelectric channel disposed between the first and second electrodes, having a horizontal structure in which the first electrode is disposed on the heat transfer layer to be arranged horizontally with respect to the solar cell, and configured to generate additional electrical energy based on a temperature difference between the first and second electrodes when heat of the solar cell based on sunlight is transferred to the first electrode through the heat transfer layer.

The thermoelectric device may have the horizontal structure based on a rectangular structure when the heat transfer layer is formed on four edge portions of the upper surface, and may have the horizontal structure based on a band-shaped straight structure when the heat transfer layer is formed on one edge portion of the upper surface.

Based on any one structure of the rectangular structure and the straight structure, the thermoelectric device may have the horizontal structure coupled to the at least one edge portion among portions where sunlight is incident on the solar cell.

Heat of the solar cell may be transferred to the first electrode through the at least one edge portion based on the horizontal structure, and the solar cell may generate electrical energy using sunlight incident on the remaining portions except the at least one edge portion.

The first and second electrodes may be formed of any one metal material of Au, Al, Pt, Ag, Ti, and W, and the thermoelectric channel may be formed of any one synthesized nanoparticle material of $Ag_2Te$, $Ag_2Se$, $Cu_2Se$, $Cu_2Te$, HgTe, HgSe, $Bi_2Te_3$, BiSeTe, BiSbTe, $Ti_3C_2$, $Mo_2C$, $Mo_2Ti_2C3$, $MoS_2$, and $WS_2$.

The thermoelectric channel may include a p-channel and an n-channel based on the synthetic material, any one of the p-channel and the n-channel may be connected to the first electrode, and the other one of the p-channel and the n-channel may be connected to the second electrode.

The solar cell may include at least one of a silicon (Si) solar cell, a dye-sensitized solar cell, a single crystalline solar cell, a polycrystalline solar cell, and a thin-film solar cell.

The heat transfer layer may be formed of at least one thermally conductive material of boron nitride (BN), reduced graphene oxide (rGO), aluminum nitride (AlN), silicon carbide (SiC), beryllium oxide (BeO), and carbon black (CB).

The heat transfer layer may control thermal conductivity to facilitate heat conduction from the solar cell to the first electrode based on the at least one thermally conductive material, and may control current flow from the solar cell to the first electrode.

The thermoelectric device may further include a substrate, and the substrate may be formed of at least one polymer material of polyether sulfone (PES), polyimide (PI), colorless polyimide (CPI), and polyethylene terephthalate (PET).

Based on the at least one polymer material, the substrate may block heat of sunlight from being transferred to the thermoelectric device.

In the thermoelectric device, a temperature difference between the first and second electrodes may be changed depending on change in an intensity of sunlight, and the temperature difference may increase through an increase in an intensity of sunlight and an increase in a channel length of the thermoelectric device.

When an intensity of sunlight is 300 W to 1,000 W, the temperature difference in the thermoelectric device may be 2.4° C. to 5.9° C.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
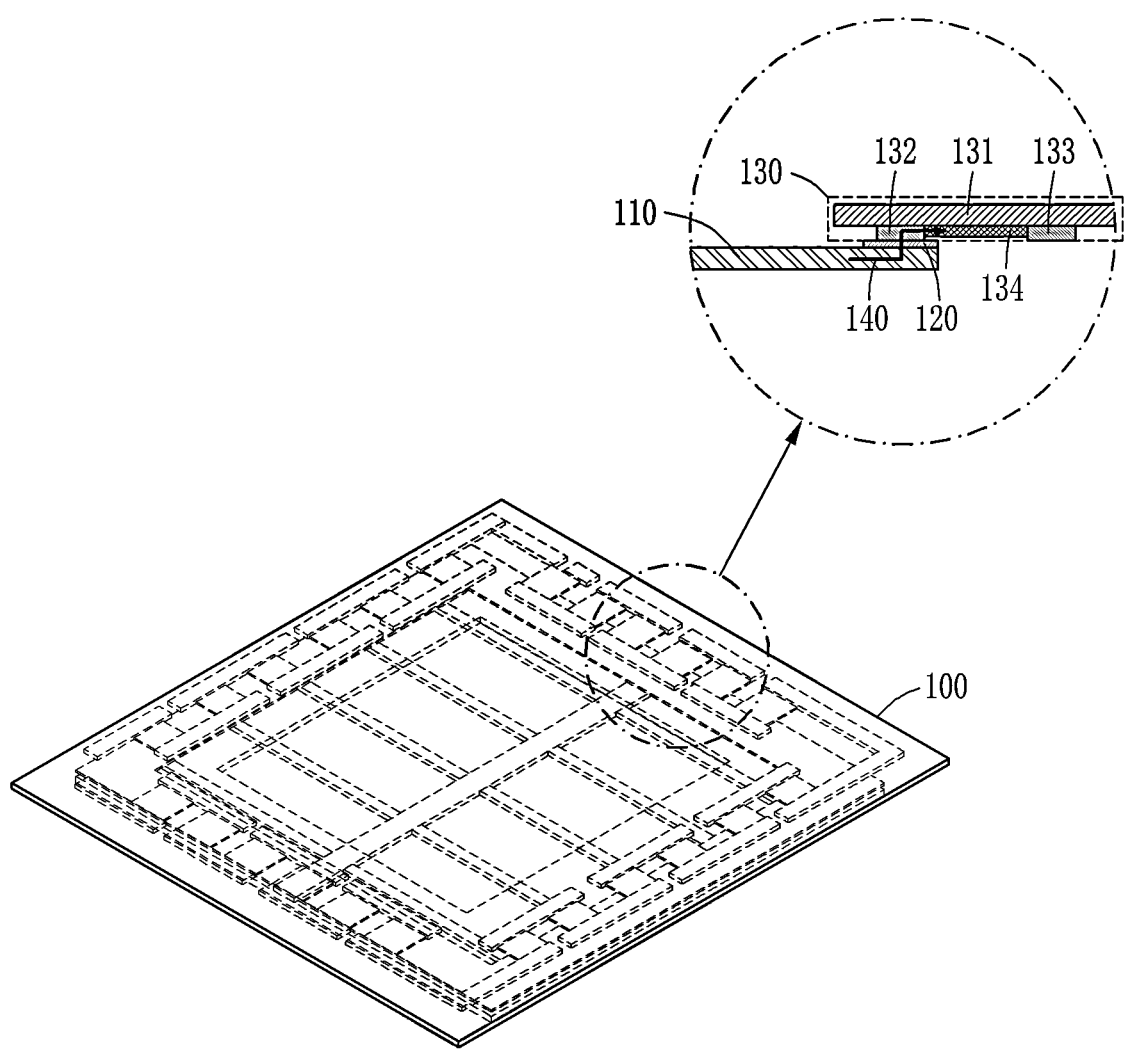
FIG. 1 illustrates an energy harvesting system using a solar cell and a thermoelectric device according to one embodiment of the present disclosure.

Hereinafter, the embodiments of the present disclosure will be described in detail with reference to the drawings.

However, it should be understood that the present disclosure is not limited to the embodiments according to the concept of the present disclosure, but includes changes, equivalents, or alternatives falling within the spirit and scope of the present disclosure.

In the following description of the present disclosure, detailed description of known functions and configurations incorporated herein will be omitted when it may make the subject matter of the present disclosure unclear.

In addition, the terms used in the specification are defined in consideration of functions used in the present disclosure, and can be changed according to the intent or conventionally used methods of clients, operators, and users. Accordingly, definitions of the terms should be understood on the basis of the entire description of the present specification.

In description of the drawings, like reference numerals may be used for similar elements.

The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), it may be directly connected or coupled to the other element or an intervening element (e.g., third) may be present.

As used herein, "configured to" may be used interchangeably with, for example, "suitable for", "ability to", "changed to", "made to", "capable of", or "designed to" in terms of hardware or software.

In some situations, the expression "device configured to" may mean that the device "may do~" with other devices or components.

For example, in the sentence "processor configured to perform A, B, and C", the processor may refer to a general purpose processor (e.g., CPU or application processor) capable of performing corresponding operation by running a dedicated processor (e.g., embedded processor) for performing the corresponding operation, or one or more software programs stored in a memory device.

In addition, the expression "or" means "inclusive or" rather than "exclusive or".

That is, unless mentioned otherwise or clearly inferred from context, the expression "x uses a or b" means any one of natural inclusive permutations.

Terms, such as "unit" or "module", etc., should be understood as a unit that processes at least one function or operation and that may be embodied in a hardware manner, a software manner, or a combination of the hardware manner and the software manner.

FIG. 1 illustrates an energy harvesting system using a solar cell and a thermoelectric device according to one embodiment of the present disclosure.

FIG. 1 illustrates the components of the energy harvesting system according to one embodiment of the present disclosure and a combined structure of a solar cell and a thermoelectric device.

Referring to FIG. 1, an energy harvesting system 100 according to one embodiment of the present disclosure includes a solar cell 110, a heat transfer layer 120, and a thermoelectric device 130.

According to one embodiment of the present disclosure, the energy harvesting system 100 is a system in which the solar cell 110 for converting solar energy into electrical energy and the thermoelectric device 130 for converting thermal energy into electrical energy are integrated, and is an energy system that generates power from sunlight or irregular energy sources present in surrounding environments and supports use of the generated power.

Referring to the enlarged view of the energy harvesting system 100, the energy harvesting system 100 includes the solar cell 110, the heat transfer layer 120, and the thermoelectric device 130, and the thermoelectric device 130 includes a substrate 131, a first electrode 132, a second electrode 133, and a thermoelectric channel 134.

For example, the solar cell 110 may generate electrical energy based on incident sunlight.

The solar cell 110 may include at least one of a silicon (Si) solar cell, a dye-sensitized solar cell, a single crystalline solar cell, a polycrystalline solar cell, and a thin-film solar cell.

That is, various types of solar cells, such as a silicon (Si) solar cell, a dye-sensitized solar cell, a single crystalline solar cell, a polycrystalline solar cell, and a thin-film solar cell, may be used as the solar cell 110.

According to one embodiment of the present disclosure, the heat transfer layer 120 is formed on at least one edge portion of the upper surface of the solar cell 110 on which sunlight is incident.

For example, the heat transfer layer 120 may be formed of at least one thermally conductive material of boron nitride (BN), reduced graphene oxide (rGO), aluminum nitride (AlN), silicon carbide (SiC), beryllium oxide (BeO), and carbon black (CB).

That is, the heat transfer layer 120 may be formed of a material, such as a carbon nanostructure, having high thermal conductivity to efficiently transfer heat from the solar cell 110 to the first electrode 132 of the thermoelectric device 130 and low electrical conductivity to suppress current flow from the solar cell 110 to the first electrode 132 of the thermoelectric device 130.

According to one embodiment of the present disclosure, the heat transfer layer 120 may control thermal conductivity so that heat conduction from the solar cell 110 to the first electrode 132 is smooth based on at least one thermally conductive material, and may control current flow from the solar cell 110 to the first electrode 132.

That is, the heat transfer layer 120 is formed by coating between the solar cell 110 and the thermoelectric device 130 to facilitate heat transfer from the solar cell 110 to the first electrode 132 of the thermoelectric device 130, and is formed of a material having high thermal conductivity and low electrical conductivity to suppress current flow.

According to one embodiment of the present disclosure, the thermoelectric device 130 includes the first electrode 132, the second electrode 133, and the thermoelectric channel 134 disposed between the first and second electrodes 132 and 133.

The thermoelectric device 130 has a horizontal structure in which the first electrode 132 is disposed on the heat transfer layer 120 to be horizontally arranged with respect to the solar cell 110.

In the thermoelectric device 130, the heat of the solar cell 110 based on sunlight is transferred to the first electrode 132 through the heat transfer layer 120 to increase the temperature of the first electrode 132. At this time, the thermoelectric device 130 may generate additional electrical energy based on the temperature difference between the first and second electrodes 132 and 133.

Accordingly, the present disclosure may provide an energy harvesting system having improved power generation performance by simultaneously converting solar energy into electrical energy in a solar cell and a thermoelectric device, and allowing the generated electrical energy to be used immediately.

For example, the first electrode 132 to which the heat of the solar cell 110 is conducted through the heat transfer layer 120 may be a hot electrode, and the second electrode 133 to which the heat of the solar cell 110 not conducted may be a cold electrode.

Here, heat flow 140 shows a flow in which heat is transferred from the solar cell 110 to the first electrode 132 of the thermoelectric device 130 through the heat transfer layer 120.

For example, the first and second electrodes 132 and 133 may be formed of any one metal material of Au, Al, Pt, Ag, Ti, and W.

For example, the thermoelectric channel 134 may be formed of any one synthesized nanoparticle material of $Ag_2Te$, $Ag_2Se$, $Cu_2Se$, $Cu_2Te$, HgTe, HgSe, $Bi_2Te_3$, BiSeTe, BiSbTe, $Ti_3C_2$, $Mo_2C$, $Mo_2Ti_2C3$, $MoS_2$, and $WS_2$.

According to one embodiment of the present disclosure, the thermoelectric channel 134 may be formed to include a p-channel and an n-channel based on a synthetic material. In this case, any one of the p-channel and the n-channel may be connected to the first electrode 132, and the other one may be connected to the second electrode 133.

For example, the thermoelectric device 130 may include the substrate 131, and the substrate 131 may be formed of at least one polymer material of polyether sulfone (PES), polyimide (PI), colorless polyimide (CPI), and polyethylene terephthalate (PET).

According to one embodiment of the present disclosure, the substrate may block transfer of heat from sunlight to the thermoelectric device based on at least one polymer material.

That is, the substrate may block heat generated when sunlight is incident from being transferred to the first electrode 132, the second electrode 133, and the thermoelectric channel 134.

According to one embodiment of the present disclosure, in the energy harvesting system 100, when the heat transfer layer 120 is formed only on the edge portions of the solar cell 110, and the thermoelectric device 130 having a horizontal structure is formed on the heat transfer layer 120 to be arranged horizontally with respect to the solar cell 110, the solar cell 110 and the thermoelectric device 130 may have a horizontal structure.

Accordingly, the present disclosure may maximize space utilization by applying a thermoelectric device to a solar cell, generate electrical energy through the solar cell, and generate additional electrical energy through the thermoelectric device using the heat of the solar cell.

In addition, the present disclosure may provide a space utilization method of increasing electrical energy production while maintaining the electrical energy production performance of a solar cell using only the minimum space of the solar cell by forming a thermoelectric device having a horizontal structure on the solar cell.

Figure 2:
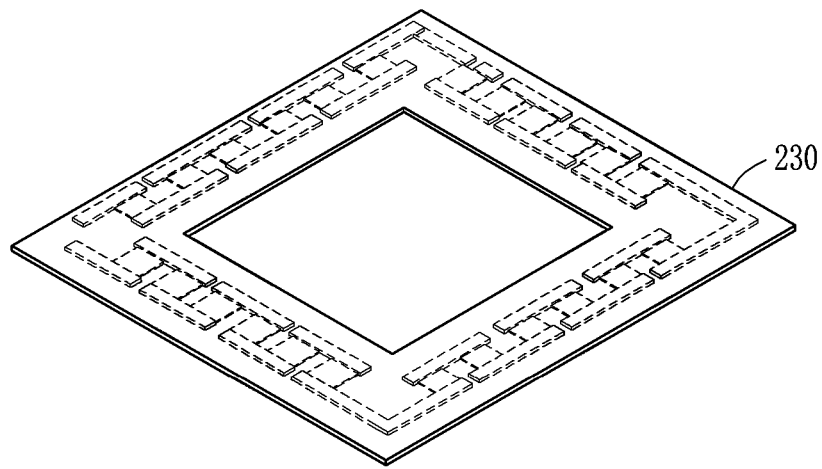
FIGS. 2 and 3 illustrate various structures of an energy harvesting system using a solar cell and a thermoelectric device according to one embodiment of the present disclosure.
Figure 2:
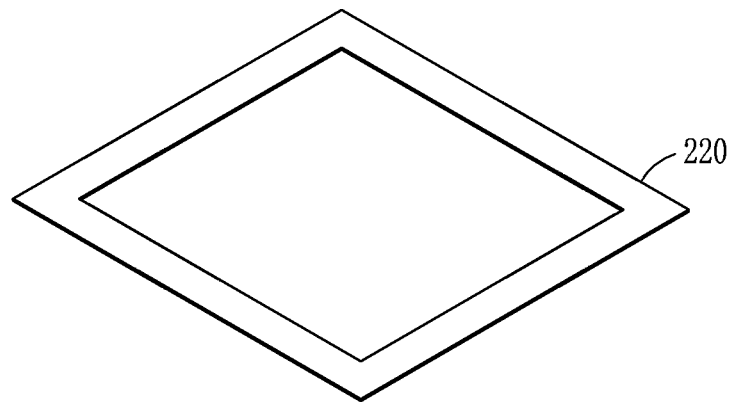
Figure 2:
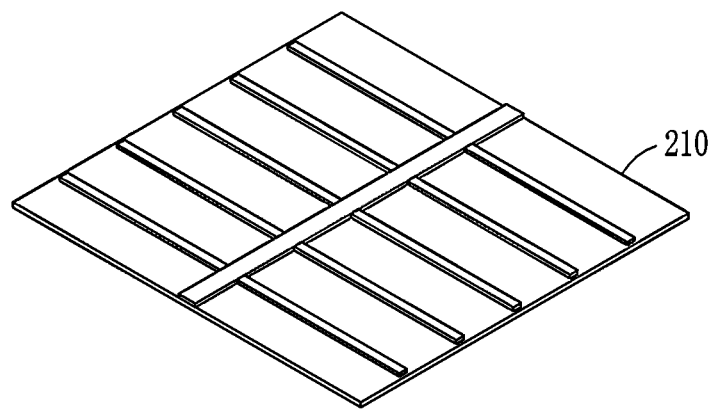
Figure 3:
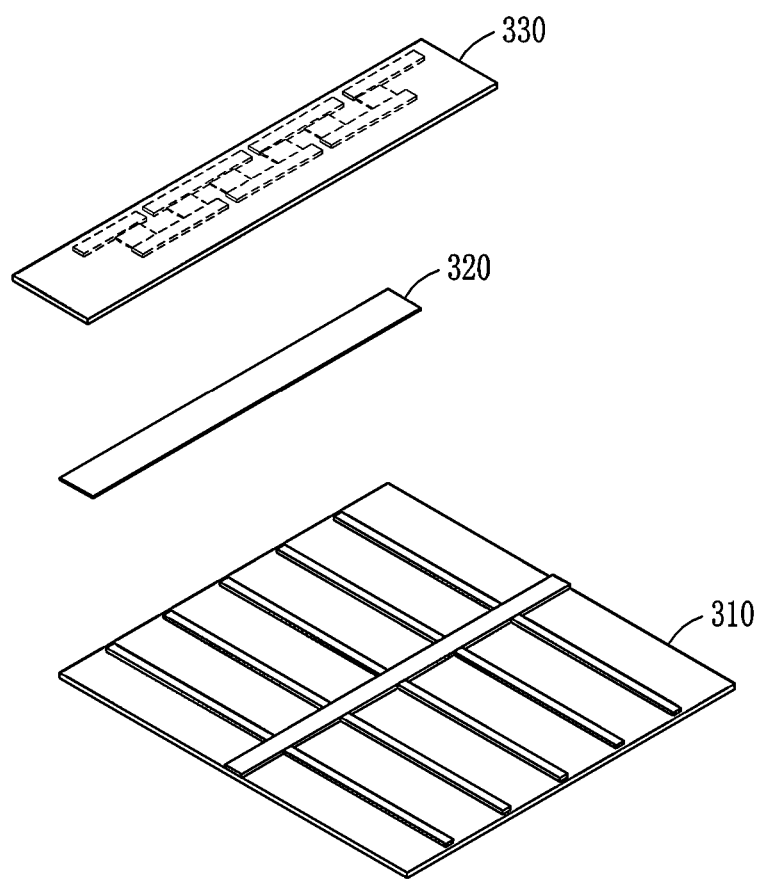

FIGS. 2 and 3 illustrate various structures of an energy harvesting system using a solar cell and a thermoelectric device according to one embodiment of the present disclosure.

FIG. 2 illustrates a structure in which the solar cell and the thermoelectric device having a rectangular structure are combined in the energy harvesting system according to one embodiment of the present disclosure.

FIG. 2 illustrates a three-dimensional structure of an energy harvesting system 200, characterized in that a heat transfer layer 220 is formed on a solar cell 210 according to one embodiment of the present disclosure and a thermoelectric device 230 is formed on the heat transfer layer 220 so that production of electrical energy by the solar cell 210 and production of electrical energy by the thermoelectric device 230 are performed at the same time.

That is, the energy harvesting system 200 according to one embodiment of the present disclosure consists of the solar cell 210, the heat transfer layer 220, and the thermoelectric device 230, and has a structure in which the solar cell 210, the heat transfer layer 220, and the thermoelectric device 230 overlap each other.

For example, when the heat transfer layer 220 is formed on four edge portions of the upper surface of the solar cell 210, the thermoelectric device 230 may have a horizontal structure based on a rectangular structure.

The thermoelectric device 230 has a horizontal structure coupled to only edge portions where the heat transfer layer 220 is formed among portions where sunlight is incident on the solar cell 210.

FIG. 3 illustrates a combined structure of a solar cell and a thermoelectric device having a straight structure in an energy harvesting system according to one embodiment of the present disclosure.

FIG. 3 illustrates a three-dimensional structure of an energy harvesting system 300, characterized in that a heat transfer layer 320 is formed on a solar cell 310 according to one embodiment of the present disclosure and a thermoelectric device 330 is formed on the heat transfer layer 320 so that production of electrical energy by the solar cell 310 and production of electrical energy by the thermoelectric device 330 are performed at the same time.

That is, the energy harvesting system 300 according to one embodiment of the present disclosure consists of the solar cell 310, the heat transfer layer 320, and the thermoelectric device 330, and has a structure in which the solar cell 310, the heat transfer layer 320, and the thermoelectric device 330 overlap each other.

For example, when the heat transfer layer 320 is formed on one edge portion of the upper surface of the solar cell 310, the thermoelectric device 330 may have the horizontal structure based on a band-shaped straight structure.

The thermoelectric device 330 has a horizontal structure coupled to only edge portions where the heat transfer layer 320 is formed among portions where sunlight is incident on the solar cell 310.

That is, based on any one of a rectangular structure and a straight structure, the thermoelectric device according to one embodiment of the present disclosure has a horizontal structure coupled to only at least one edge portion among portions where sunlight is incident on the solar cell.

Accordingly, the present disclosure may increase the production of electrical energy without additional space by fabricating a thermoelectric device having a horizontal structure using a semiconductor process technology to be smaller than a solar cell.

In addition, the present disclosure may improve energy harvesting performance by securing high thermal conductivity from a solar cell to a thermoelectric device while securing the electrical energy production efficiency of the solar cell based on a horizontal structure of the solar cell and the thermoelectric device.

Figure 4:
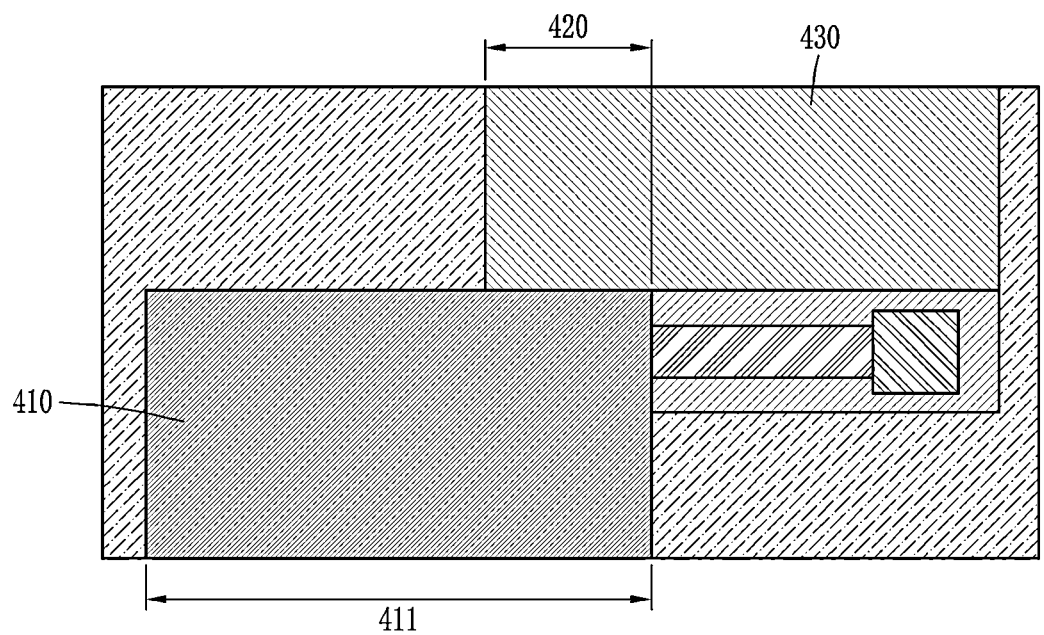
FIG. 4 illustrates a horizontal structure of an energy harvesting system using a solar cell and a thermoelectric device according to one embodiment of the present disclosure.

FIG. 4 illustrates a horizontal structure of an energy harvesting system using a solar cell and a thermoelectric device according to one embodiment of the present disclosure.

Referring to FIG. 4, a solar cell 410 according to one embodiment of the present disclosure and a thermoelectric device 430 have an overlapping region corresponding to a portion where a heat transfer layer 420 is formed.

For example, the overlapping region has a size of 0.1 mm. If it is assumed that a width 411 of the solar cell 410 is 1 cm, the ratio of the overlapping region in the solar cell 410 is 1/100.

That is, since the thermoelectric device 430 is formed to have a horizontal structure with respect to the solar cell 410, only the minimum space of the solar cell 410 may be used.

In addition, the first electrode of the thermoelectric device 430 may be positioned at a portion where the heat transfer layer 420 is formed.

According to one embodiment of the present disclosure, heat of the solar cell 410 is transferred to the first electrode of the thermoelectric device 430 through at least one edge portion based on a horizontal structure, and the solar cell 410 generates electrical energy using sunlight incident on the remaining portions except the at least one edge portion, thereby improving the efficiency of the solar cell 410.

For example, heat of the solar cell 410 is transferred to the first electrode of the thermoelectric device 430 through at least one edge portion based on a horizontal structure with respect to the thermoelectric device 430, and sunlight is incident on the remaining portions except the at least one edge portion. Thus, compared to a conventional vertical structure in which a thermoelectric device is formed under the solar cell 410, the production of electrical energy may be increased.

For example, the energy harvesting system may maximize the space utilization of the solar cell 410 to prevent a decrease in the efficiency of the solar cell 410, and may generate electrical energy from the solar cell 410 and the thermoelectric device 430 using sunlight at the same time.

That is, the energy harvesting system may generate electrical energy by combining electrical energy generated by the solar cell 410 and additional electrical energy generated by the thermoelectric device 430.

For example, the energy harvesting system may be fabricated as a fusion device by bonding the solar cell 410 and the thermoelectric device 430 fabricated by coating the edge portions of the upper surface of the solar cell 410 with the heat transfer layer 420.

In addition, to fabricate the energy harvesting system, the thermoelectric device 430 having a rectangular structure or a band structure may be directly bonded to the heat transfer layer 420 formed on the solar cell 410 by coating. Alternatively, when necessary, the inside of the substrate excluding the thermoelectric channel may be removed through a cutting process, and then bonding may be performed.

Accordingly, the present disclosure may provide an energy harvesting system capable of increasing the lifespan and operating time of products when applied to wearable devices, non-powered sensors, home appliances, and industrial apparatus, and capable of playing a key power supply role in various fields ranging from home appliances to industrial apparatus by using the energy of the natural world.

In addition, the present disclosure may provide an energy harvesting system that aids in overcoming an energy crisis by creating various social and cultural innovations when applied to the fourth industry and wearable devices.

Figure 5:
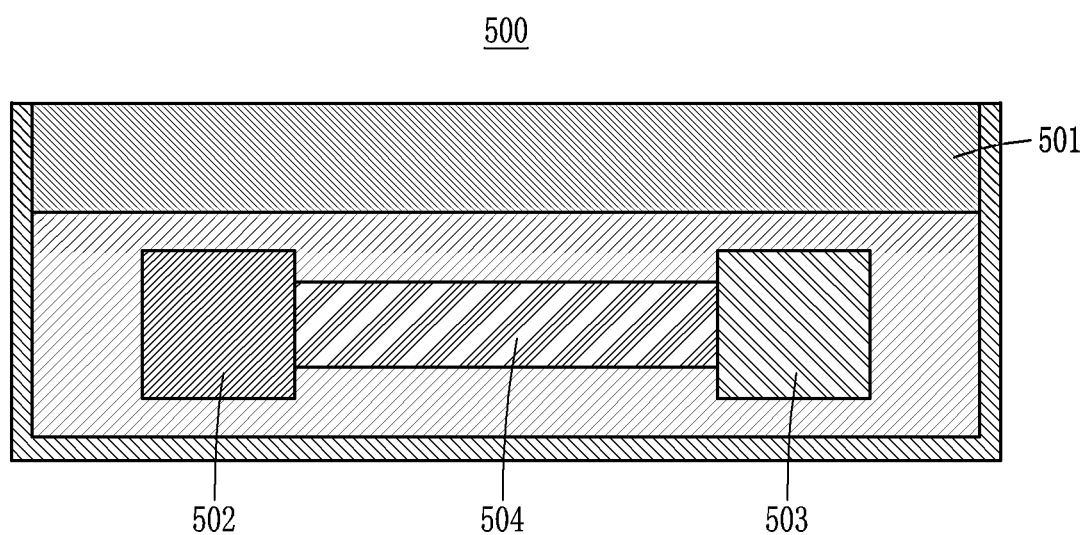
FIG. 5 illustrates the thermoelectric device of an energy harvesting system according to one embodiment of the present disclosure.

FIG. 5 illustrates a thermoelectric device of an energy harvesting system according to one embodiment of the present disclosure.

FIG. 5 illustrates the structure of the thermoelectric device according to one embodiment of the present disclosure.

Referring to FIG. 5, a thermoelectric device 500 according to one embodiment of the present disclosure consists of a substrate 501, a first electrode 502, a second electrode 503, and a thermoelectric channel 504.

For example, the thermoelectric device 500 includes the first electrode 502 as a hot electrode and the second electrode 503 as a cold electrode, and the thermoelectric channel 504 is a nanoparticle thin film and includes a p-channel and an n-channel.

The thermoelectric device 500 may convert a thermoelectric voltage into additional electrical energy by using a temperature difference between the first and second electrodes 502 and 503.

Materials for forming the substrate 501, the first electrode 502, the second electrode 503, and the thermoelectric channel 504 are the same as those described with reference to FIG. 1.

According to one embodiment of the present disclosure, in the thermoelectric device 500, since a plurality of pn arrays may be formed in a small area, electrical energy may be generated using only a small amount of thermal energy.

In addition, the thermoelectric device 500 may implement an energy system having excellent space efficiency and a high degree of integration.

In addition, since the thermoelectric device 500 has a horizontal structure with respect to the solar cell, a problem occurring in a vertical structure, that is, a decrease in the efficiency of a solar cell due to heat dissipation from the bottom of the solar cell, may be prevented.

Figure 6:
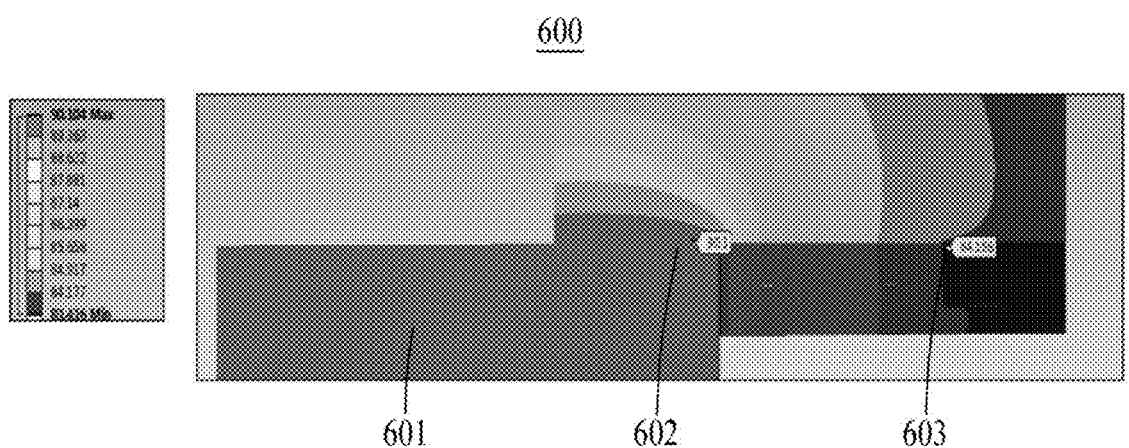
FIG. 6 is a drawing for explaining the results of measuring the temperature distribution of an energy harvesting system according to one embodiment of the present disclosure.

FIG. 6 is a drawing for explaining the results of measuring the temperature distribution of an energy harvesting system according to one embodiment of the present disclosure.

Referring to an image 600 of FIG. 6 showing the results of temperature distribution measurement, heat 601 of a solar cell is transferred through a heat transfer layer to a point 602 at which a first electrode is positioned, thereby generating a temperature difference between the point 602 and a point 603 at which a second electrode is positioned.

As shown in the image 600, in an energy harvesting system, the heat transfer layer is formed by coating between the solar cell and the thermoelectric device. With this configuration, the efficiency of the solar cell is maintained, and heat transfer to the thermoelectric device is facilitated.

That is, the energy harvesting system according to one embodiment of the present disclosure may maintain the output of the solar cell, and may generate additional energy by transferring heat of the solar cell to the thermoelectric device.

For example, temperature measured at the point 602 may be 90.1° C., and temperature measured at the point 603 may be 84.2° C.

Accordingly, through the heat transfer layer formed by coating between the solar cell and the thermoelectric device, the energy harvesting system may transfer heat of the solar cell to the first electrode of the thermoelectric device without an additional heat source.

Figure 7:
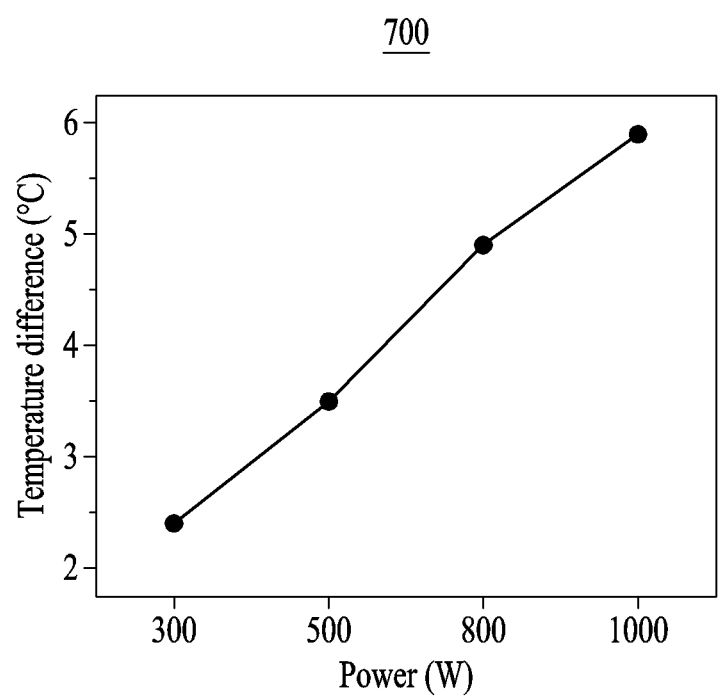
FIG. 7 is a graph showing temperature difference depending on the intensity of sunlight in the thermoelectric device of an energy harvesting system according to one embodiment of the present disclosure.

FIG. 7 is a graph showing temperature difference depending on the intensity of sunlight in the thermoelectric device of an energy harvesting system according to one embodiment of the present disclosure.

Referring to FIG. 7, a graph 700 shows change in the temperature difference between a first electrode and a second electrode depending on change in power corresponding to the intensity of sunlight.

The temperature difference between the first and second electrodes depending on change in power corresponding to the intensity of sunlight incident on the energy harvesting system according to one embodiment of the present disclosure is summarized in Table 1 below.

For example, the first electrode may correspond to a hot electrode, the temperature of which increases by receiving heat from a solar cell through a heat transfer layer. The second electrode may share a thermoelectric channel with the first electrode. Since the second electrode does not receive heat from the solar cell, the second electrode may correspond to a cold electrode having a relatively low temperature.

TABLE 1

| Intensity of sunlight | Temperature of first electrode | Temperature of second electrode | Temperature difference |
| --- | --- | --- | --- |
| 300 W | 59.8° C. | 57.4° C. | 2.4° C. |
| 500 W | 71.0° C. | 67.5° C. | 3.5° C. |
| 800 W | 83.5° C. | 78.6° C. | 4.9° C. |
| 100 W | 90.1° C. | 84.2° C. | 5.9° C. |

Referring to Table 1, it can be seen that, as the intensity of sunlight increases, the temperature difference between the first and second electrodes increases.

In the solar cell, as the intensity of sunlight increases, the production of electrical energy increases. In the thermoelectric device, as the temperature difference between the first and second electrodes increases, the production of electrical energy increases.

For example, in the thermoelectric device, the temperature difference between the first and second electrodes may change depending on change in the intensity of sunlight.

For example, when the intensity of sunlight is 300 W to 1,000 W, temperature difference in the thermoelectric device may be 2.4° C. to 5.9° C.

In addition, in the thermoelectric device, temperature difference may increase through an increase in the intensity of sunlight and an increase in the channel length of the thermoelectric device.

That is, when the intensity of sunlight or the channel length of the thermoelectric device increases, temperature difference may be more than 5.9° C. Accordingly, temperature difference is not limited in the above-described range.

Accordingly, the present disclosure may improve energy harvesting performance by securing high thermal conductivity from a solar cell to a thermoelectric device while securing the electrical energy production efficiency of the solar cell based on a horizontal structure of the solar cell and the thermoelectric device.

The present disclosure can maximize space utilization by applying a thermoelectric device to a solar cell, generate electrical energy through the solar cell, and generate additional electrical energy through the thermoelectric device using the heat of the solar cell.

The present disclosure can provide a space utilization method of increasing electrical energy production while maintaining the electrical energy production performance of a solar cell using only the minimum space of the solar cell by forming a thermoelectric device having a horizontal structure on the solar cell.

The present disclosure can provide an energy harvesting system having improved power generation performance by simultaneously converting solar energy into electrical energy in a solar cell and a thermoelectric device, and allowing the generated electrical energy to be used immediately.

The present disclosure can increase the production of electrical energy without additional space by fabricating a thermoelectric device having a horizontal structure using a semiconductor process technology to be smaller than a solar cell.

The present disclosure can improve energy harvesting performance by securing high thermal conductivity from a solar cell to a thermoelectric device while securing the electrical energy production efficiency of the solar cell based on a horizontal structure of the solar cell and the thermoelectric device.

The present disclosure can provide an energy harvesting system capable of increasing the lifespan and operating time of products when applied to wearable devices, non-powered sensors, home appliances, and industrial apparatus, and capable of playing a key power supply role in various fields ranging from home appliances to industrial apparatus by using the energy of the natural world.

The present disclosure can provide an energy harvesting system that aids in overcoming an energy crisis by creating various social and cultural innovations when applied to the fourth industry and wearable devices.

In the above-described specific embodiments, elements included in the invention are expressed in singular or plural in accordance with the specific embodiments shown.

However, it should be understood, however, that the singular or plural representations are to be chosen as appropriate to the situation presented for the purpose of description and that the above-described embodiments are not limited to the singular or plural constituent elements. The constituent elements expressed in plural may be composed of a single number, and constituent elements expressed in singular form may be composed of a plurality of elements.

In addition, the present disclosure has been described with reference to exemplary embodiments, but it should be understood that various modifications may be made without departing from the scope of the present disclosure.

Therefore, the scope of the present disclosure should not be limited by the embodiments, but should be determined by the following claims and equivalents to the following claims.

What is claimed is:

1. An energy harvesting system, comprising:
   a solar cell for generating electrical energy based on sunlight;
   a heat transfer layer formed on at least one edge portion of an upper surface of the solar cell on which sunlight is incident; and
   a thermoelectric device comprising a substrate, a first electrode, a second electrode, a thermoelectric channel disposed between the first and second electrodes, having a horizontal structure in which the first electrode is disposed on the heat transfer layer to be arranged horizontally with respect to the solar cell, and configured to generate additional electrical energy based on a temperature difference between the first and second electrodes when heat of the solar cell based on sunlight is transferred to the first electrode through the heat transfer layer,
   wherein heat of the solar cell is transferred to the first electrode through the at least one edge portion based on the horizontal structure, and the solar cell generates electrical energy using sunlight incident on the remaining portions except the at least one edge portion,
   wherein the substrate blocks heat generated along with sunlight from being transferred to the second electrode and the thermoelectric channel, and
   wherein the substrate is located on an upper surface of the thermoelectric device on which light is incident.

2. The energy harvesting system according to claim 1, wherein the thermoelectric device has the horizontal structure based on a rectangular structure when the heat transfer layer is formed on four edge portions of the upper surface.

3. The energy harvesting system according to claim 2, wherein, based on the rectangular structure, the thermoelectric device has the horizontal structure coupled to the at least one edge portion among portions where sunlight is incident on the solar cell.

4. The energy harvesting system according to claim 1, wherein the first and second electrodes are formed of any one metal material of Au, Al, Pt, Ag, Ti, and W, and the thermoelectric channel is formed of any one synthesized nanoparticle material of Ag2Te, Ag2Se, Cu2Se, Cu2Te, HgTe, HgSe, Bi2Te3, BiSeTe, BiSbTe, Ti3C2, Mo2C, Mo2Ti2C3, MoS2, and WS2.

5. The energy harvesting system according to claim 4, wherein the thermoelectric channel comprises a p-channel and an n-channel based on the synthesized nanoparticle material, any one of the p-channel and the n-channel is connected to the first electrode, and the other one of the p-channel and the n-channel is connected to the second electrode.

6. The energy harvesting system according to claim 1, wherein the solar cell comprises at least one of a silicon (Si) solar cell, a dye-sensitized solar cell, a single crystalline solar cell, a polycrystalline solar cell, and a thin-film solar cell.

7. The energy harvesting system according to claim 1, wherein the heat transfer layer is formed of at least one thermally conductive material of boron nitride (BN), reduced graphene oxide (rGO), aluminum nitride (AlN), silicon carbide (SiC), beryllium oxide (BeO), and carbon black (CB).

8. The energy harvesting system according to claim 7, wherein the heat transfer layer controls thermal conductivity to facilitate heat conduction from the solar cell to the first electrode based on the at least one thermally conductive material, and controls current flow from the solar cell to the first electrode.

9. The energy harvesting system according to claim 1, wherein the substrate is formed of at least one polymer material of polyether sulfone (PES), polyimide (PI), colorless polyimide (CPI), and polyethylene terephthalate (PET).

10. The energy harvesting system according to claim 1, wherein, in the thermoelectric device, a temperature difference between the first and second electrodes is changed depending on change in an intensity of sunlight, and the temperature difference increases through an increase in an intensity of sunlight and an increase in a channel length of the thermoelectric device.

11. The energy harvesting system according to claim 10, wherein, when an intensity of sunlight is 300 W to 1,000 W, the temperature difference in the thermoelectric device is 2.4° C. to 5.9° C.

12. The energy harvesting system according to claim 1, wherein the thermoelectric device has the horizontal structure based on a band-shaped straight structure when the heat transfer layer is formed on one edge portion of the upper surface.

* * * * *